US009973190B2

(12) United States Patent
Hahs et al.

(10) Patent No.: US 9,973,190 B2
(45) Date of Patent: May 15, 2018

(54) CAPACITIVE PROXIMITY AND/OR CONTACT SWITCH

(71) Applicant: DIEHL AKO STIFTUNG & CO. KG, Wangen (DE)

(72) Inventors: Charles Hahs, Wroclaw (PL); Dirk Golz, Markdorf (DE); Bernd Theobold, Wangen (DE); Uwe Heimann, Wangen (DE)

(73) Assignee: Diehl AKO Stiftung & Co. KG, Wangen (DE)

( * ) Notice: Subject to any disclaimer, the term of this patent is extended or adjusted under 35 U.S.C. 154(b) by 735 days.

(21) Appl. No.: 13/888,427

(22) Filed: May 7, 2013

(65) Prior Publication Data

US 2013/0292239 A1 Nov. 7, 2013

(30) Foreign Application Priority Data

May 7, 2012 (EP) ..................................... 12461514

(51) Int. Cl.
*H03K 17/975* (2006.01)
*H03K 17/955* (2006.01)
*H03K 17/96* (2006.01)

(52) U.S. Cl.
CPC ......... *H03K 17/955* (2013.01); *H03K 17/962* (2013.01); *H03K 2217/96076* (2013.01); *H03K 2217/96077* (2013.01); *H03K 2217/96079* (2013.01)

(58) Field of Classification Search
CPC ............... H03K 17/955; H03K 17/962; H03K 2217/96079; H03K 2217/96077; H03K 2217/96076

USPC ......................................................... 200/600
See application file for complete search history.

(56) References Cited

U.S. PATENT DOCUMENTS

| 5,917,165 | A | 6/1999 | Platt et al. | |
|---|---|---|---|---|
| 6,403,904 | B1 | 6/2002 | Schilling | |
| 7,532,131 | B2 * | 5/2009 | Schaefer et al. | 341/22 |
| 7,652,220 | B2 * | 1/2010 | Weiss | H03K 17/962 200/600 |
| 8,735,755 | B2 * | 5/2014 | Peterson et al. | 200/600 |
| 8,823,675 | B2 * | 9/2014 | Sleeman | 345/174 |
| 2005/0179673 | A1 | 8/2005 | Philipp | |
| 2006/0131159 | A1 | 6/2006 | Kaps et al. | |

(Continued)

FOREIGN PATENT DOCUMENTS

| DE | 202005002157 U1 | 4/2005 |
|---|---|---|
| DE | 102008052816 A1 | 4/2010 |

(Continued)

*Primary Examiner* — Edwin A. Leon
*Assistant Examiner* — Lheiren Mae A Caroc
(74) *Attorney, Agent, or Firm* — Laurence A. Greenberg; Werner H. Stemer; Ralph E. Locher

(57) ABSTRACT

A capacitive proximity and/or contact switch includes a cover plate having an upper side and an underside. The upper side provides a sensitive area of the switch and the cover plate, at least in the region of the sensitive area, is at least partially non-conductive. A conductive sensor face is disposed at a distance from the underside of the cover plate. The dielectric system of this capacitive proximity and/or contact switch is formed of the cover plate, at least one non-conductive element facing towards the sensor face and at least one conductive element between the cover plate and the non-conductive element.

16 Claims, 11 Drawing Sheets

(56) References Cited

U.S. PATENT DOCUMENTS

2007/0095643 A1     5/2007   Weiss et al.
2007/0103451 A1     5/2007   Heimann et al.
2012/0261242 A1*   10/2012   Guard et al. .................. 200/600

FOREIGN PATENT DOCUMENTS

| EP | 1030536 | A2 | 8/2000 |
| EP | 0859467 | B1 | 4/2002 |
| EP | 1672797 | B1 | 7/2009 |
| EP | 1786107 | B1 | 3/2010 |
| EP | 2159917 | A1 | 3/2010 |
| EP | 2341624 | A1 | 7/2011 |
| WO | 2009153161 | A1 | 12/2009 |

* cited by examiner

CAPACITIVE PROXIMITY AND/OR CONTACT SWITCH

CROSS-REFERENCE TO RELATED APPLICATION

This application claims the priority, under 35 U.S.C. § 119, of European patent application EP 12 461 514.7, filed May 7, 2012; the prior application is herewith incorporated by reference in its entirety.

BACKGROUND OF THE INVENTION

Field of the Invention

The present invention relates to a capacitive proximity switch and/or contact switch. The switch is, in particular, adapted to be used in a control panel of an electrical appliance.

Switches which trigger a certain switching operation simply by a user touching or approaching them are being used ever more frequently in many electrical appliances, particularly in the context of domestic appliances such as cookers, stoves, ranges, ovens, cook tops, microwave ovens, dishwashers, washing machines, clothes dryers and the like. In the case of a capacitance switch, a capacitive sensor element together with the finger of a user, through a touch panel acting as a dielectric, forms a capacitance which is variable depending on operation of the switch, i.e. a sensitive area of the touch panel that is associated with the capacitive sensor element is being touched/approached or not being touched/approached. The change in capacitance of the capacitive sensor element, due to it being touched or at least approached by a user, has a corresponding effect on an output signal from a sensor circuit comprising the sensor element which output signal is correspondingly evaluated by a connected evaluation circuit as operation of the capacitive switch.

In many cases it is desirable in capacitive switches to locate the carrier plate (e.g. printed circuit board) which includes the electrical circuits for capacitive sensing remotely from the touch area. The problem of spanning the distance between the sensitive area of the cover plate and the carrier plate is conventionally solved by adding a space-taking, electrically conductive element which is directly electrically connected to a sensor/evaluation circuit. Thus, the sensor face of the capacitive switch is provided by the upper side of the conductive element facing towards the cover plate. In other words, in conventional systems, the sensor face of the capacitive switch is moved towards the underside of the cover plate by means of the additional conductive element. That is, the dielectric of such a capacitive switch is formed by the non-conductive cover plate only.

Conventional capacitive switches of this general kind are described, by way of example, in the following patent publications: U.S. Pat. No. 5,917,165 and its counterpart European patent EP 0 859 467 B1; US Patent Application Publication US 2006/0131159 A1 and its counterpart European patent EP 1 672 797 B1; US Patent Application Publication US 2007/0103451 A1 and its counterpart European patent EP 1 786 107 B1; and in European patent application EP 2 341 624 A1.

The capacitive switch known from U.S. Pat. No. 5,917,165 and European patent EP 0 859 467 B1 comprises a flexible, conductive body (e.g. foam) which, optionally accompanied by the interposing of an electrically conductive adhesive, is directly applied to a metallic contact face of the mounting board.

US 2006/0131159 A1 and EP 1 672 797 B1 describe a capacitive touch switch which comprises a flexible, electrically non-conductive body which is at least partially surrounded by an electrically conductive mesh to form a conductive element being applied to the contact face on the carrier plate.

Instead of using a flexible, electrically conductive body as conductive element, US 2007/0103451 A1, EP 1 786 107 B1 and EP 2 341 624 A1 each suggest to use a compression spring that is in electrically conductive contact with the sensor/evaluation circuit.

In all of these conventional capacitive switches, the conductive element being a flexible body or a compression spring has to be directly electrically connected to the sensor/evaluation circuit. The required electrical connection is conventionally made by means of solder, a conductive adhesive or a direct conductor/conductor contact between the conductive element and a contact face/element on the carrier plate. Such an electrical connection is expensive in manufacturing. Also, it has to be ensured that the electrical connection is stable during the life time of the switch.

SUMMARY OF THE INVENTION

It is accordingly an object of the invention to provide a capacitive proximity or contact switch which overcome the above-mentioned disadvantages of the heretofore-known devices and methods of this general type and which provides for an improved such switch with a carrier plate at a distance from the cover plate which can be easily manufactured.

With the foregoing and other objects in view there is provided, in accordance with the invention, a capacitive switch, configured to function as a capacitive proximity and/or contact switch. The switch comprises:

a cover plate having an upper side and an underside, said upper side forming a sensitive area of the switch, said cover plate, at least in a region of said sensitive area, being at least partially non-conductive;

a conductive sensor face disposed at a spacing distance from said underside of said cover plate; and a dielectric system formed of said cover plate, at least one non-conductive element facing towards said sensor face and at least one conductive element disposed between said cover plate and said non-conductive element.

In other words, the objects are achieved, according to the present invention, by a capacitive proximity and/or contact switch, comprising a cover plate having an upper side and an underside, wherein the upper side provides a sensitive area of the switch and the cover plate at least in the region of the sensitive area is at least partially non-conductive; and a conductive sensor face being disposed at a distance from the underside of the cover plate. Further, a dielectric system of this capacitive proximity and/or contact switch comprises the cover plate, at least one non-conductive element facing towards the sensor face and at least one conductive element arranged between the cover plate and the non-conductive element. In other words, the dielectric system of the inventive capacitive proximity and/or contact switch comprises the cover plate, at least one conductive element arranged between the cover plate and the sensor face, and at least one non-conductive element arranged between the conductive element and the sensor face.

Since the dielectric system of the capacitive switch comprises the cover plate, at least one non-conductive element facing towards the sensor face and at least one conductive element arranged between the cover plate and the non-conductive element, contrary to the above described conventional configurations, the sensor face can be kept remote from the cover plate instead of being moved towards the underside of the cover plate by means of a conductive element.

As a result, no electrical connection is required for the conductive element disposed below/behind the cover plate. By avoiding such an electrical connection, a very stable condition is achieved and the manufacturing costs are reduced.

In addition, by including at least one conductive element and at least one non-conductive element facing towards the sensor face in the dielectric system, the distance between the sensor face acting as the one capacitor plate and a user's finger acting as the other capacitor plate can be increased, and the dielectric system therebetween is determined mainly by the dielectric of the cover plate and the non-conductive element. Thus, although keeping the sensor face remote from the cover plate it is possible to evaluate the change in capacitance of the capacitive switch, due to it being touched or at least approached by a user, effectively and reliably.

The terms "conductive" and "non-conductive" are to be understood as electrically conductive and non-conductive, respectively. A non-conductive material has no property of conducting electricity or a practically negligible property of conducting electricity.

The cover plate, by way of example, is formed of plastics, glass or glass-ceramics. The cover plate can also be made of an electrically conductive material such as a metal. In the last-mentioned case the cover plate includes a non-conductive portion made e.g. of plastics in the region of the sensitive area. The cover plate may be made at least partially translucent or opaque.

The sensitive area is defined as the area of the upper side of the cover plate where a user shall approach or touch the cover plate e.g. with his/her finger to operate the switch. Preferably, the sensitive area of the switch is optically and/or haptically marked for the user.

The sensor face is an electrically conductive face which is arranged substantially parallel to the cover plate so that the sensor face forms one capacitor plate of the capacitive switch. The sensor face preferably is electrically connected to a sensor circuit of the capacitive switch.

The term "dielectric system" of the capacitive switch is to be interpreted as the whole dielectric being disposed between the sensor face acting as the one capacitor plate and a user's finger acting as the other capacitor plate of the capacitive switch.

The at least one conductive element of the dielectric system is to be understood as any element having electrically conductive properties. In this sense, the conductive element can be made from an electrically conductive material (e.g. metal). In this sense, the conductive element can also comprise a body made from an electrically non-conductive material wherein the body is at least partially surrounded or encapsulated by an electrically conductive layer (e.g. conductive paint or coating) and/or has integrated electrically conductive components.

The at least one non-conductive element of the dielectric system is to be understood as any element having no or at least only negligible electrically conductive properties. In this sense, the non-conductive element can be made from an electrically non-conductive material (e.g. plastics). In this sense, the non-conductive element can also comprise a body made from an electrically conductive material wherein the body is essentially totally surrounded or encapsulated by an electrically non-conductive layer (e.g. paint or coating) or casing.

In accordance with a preferred configuration of the invention, at least one luminous element is provided at a distance from the underside of the cover plate. In this configuration, the dielectric system is at least partially translucent, i.e. at least partially made of a translucent material and/or comprising at least one opening. With this configuration, the sensitive area of the cover plate can be back-lit. Thus, the sensitive area can be marked and/or can be used as a display. Preferably, the back-lit sensitive area can display a current operating status e.g. of an electrical appliance. The at least one luminous element is preferably a light emitting diode (LED, RGB-LED).

Preferably, at least one light guiding element is disposed between the at least one luminous element and the cover plate. Such a light guiding element can reduce radiation losses from the luminous element.

In a preferred configuration of the invention, the at least one conductive element of the dielectric system comprises a conductive display housing having at least one light guiding element extending therethrough. The at least one light guiding element makes a back-lit sign for the sensitive area of the cover plate. Preferably, the at least one conductive element comprises a conductive 7-segment-display housing having seven light guiding elements extending therethrough.

In accordance with a preferred configuration of the invention, the conductive element of the dielectric system comprises an elastic and/or flexible element. Preferably, the conductive element of the dielectric system comprises a conductive foam, plastic or rubber body or a conductive compression spring.

In accordance with a preferred configuration of the invention, the conductive element is connected to the non-conductive element of the dielectric system by means of an adhesive, preferably a non-conductive adhesive.

According to a preferred configuration of the invention, the sensor face is disposed on an upper side of a carrier plate, wherein this carrier plate is disposed at a distance from the underside of the cover plate and the upper side of this carrier plate faces towards the underside of the cover plate. In this configuration, the non-conductive element of the dielectric system comprises an insulator. Preferably, this insulator comprises a solder mask.

According to an alternative configuration of the invention, the sensor face is disposed on an underside of a carrier plate, wherein this carrier plate is disposed at a distance from the underside of the cover plate and the upper side of this carrier plate faces towards the underside of the cover plate. In this configuration, the non-conductive element of the dielectric system comprises the carrier plate. This configuration may have an advantage that a single-sided carrier plate, i.e. a carrier plate with electronic components only at the underside thereof can be used.

In other configurations, the carrier plate may be arbitrarily oriented relative to the cover plate. Especially, the carrier plate may be disposed substantially rectangular to the cover plate or far away from the cover plate. In such a configuration, the sensor face is electrically connected to the carrier plate, especially to a sensor/evaluation circuit on that carrier plate, e.g. by wire.

In this connection, the carrier plate can be a rigid plate or a flexible plate. The carrier plate preferably has a thickness from foil thickness up to a few mm. Preferably, the carrier plate is a printed circuit board (PCB). Preferably, the sensor face disposed on the upper side or the underside of the carrier plate is in the form of an electrically conductive copper pad. The sensor/evaluation circuit may also be mounted on the carrier plate.

In accordance with a preferred configuration of the invention, the dielectric system further comprises at least one non-conductive element provided between the cover plate and the conductive element.

The present invention also relates to a control panel, especially for an electrical appliance, comprising at least one capacitive proximity and/or contact switch according to the present invention as described above.

According to a preferred configuration of the invention, the control panel comprises a plurality of capacitive proximity and/or contact switches. In this case, the plurality of switches preferably comprises a common cover plate. Preferably, the plurality of switches also comprises a common carrier plate.

Other features which are considered as characteristic for the invention are set forth in the appended claims.

Although the invention is illustrated and described herein as embodied in a capacitive proximity and/or contact switch, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
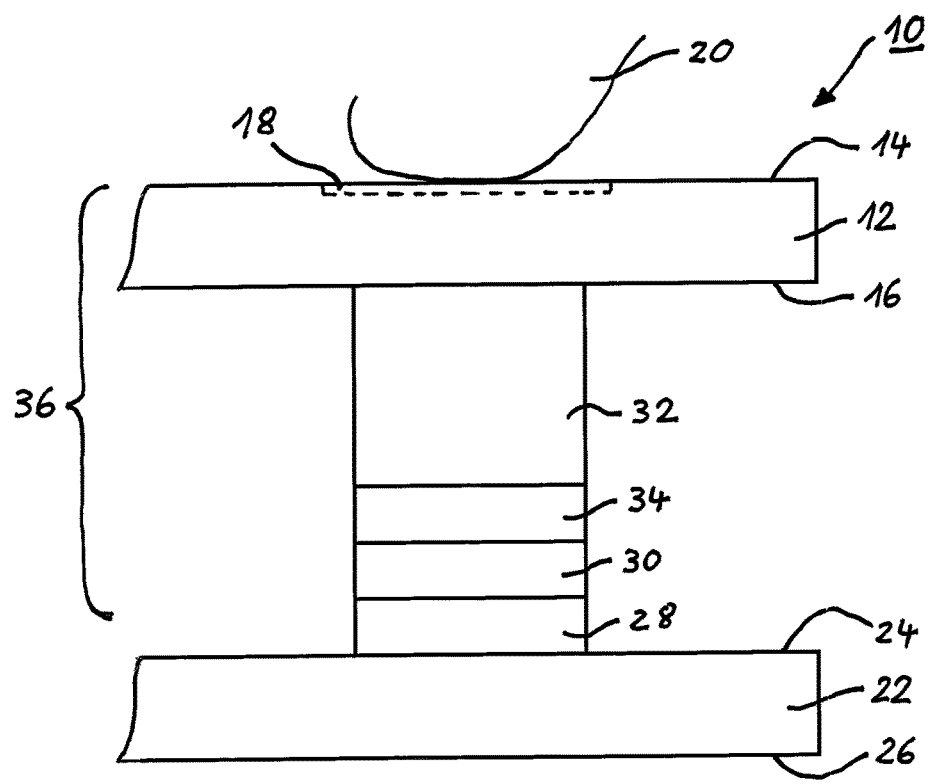
FIG. 1 is a diagrammatic, side-elevational view of a capacitive switch illustrating the basic concept of the present invention according to a first configuration.

Referring now to the figures of the drawing in detail and first, particularly, to FIG. 1 thereof, there is shown a configuration of a capacitive proximity and/or contact switch according to a first basic concept of the present invention.

The capacitive proximity and/or contact switch 10 comprises a cover plate 12 made of an electrically non-conductive material. The cover plate 12 has an upper side 14 and an underside 16. A sensitive area 18 is provided at the upper side 14 of the cover plate 12. This sensitive area 18 may be optically and/or haptically marked for a user. The switch 10 can be operated by a user by touching the sensitive area 18 with a finger 20 or by at least approaching a finger 20 to this sensitive area 18.

A non-conductive carrier plate 22, e.g. in the form of a printed circuit board (PCB), is disposed at a distance below the cover plate 12 and substantially parallel to the cover plate 12. The carrier plate 22 has an upper side 24 facing towards the cover plate 12 and an underside 26. The carrier plate 22 may also include a sensor/evaluation circuit (not shown).

In the configuration shown in FIG. 1, a sensor face 28—for example, in the form of a copper pad—is provided on the upper side 24 of the carrier plate 24. This sensor face 28 is positioned in correspondence to the sensitive area 18 of the cover plate 12, as shown in FIG. 1, or alternatively may be offset therefrom. The sensor face 28 is connected to the sensor/evaluation circuit.

A preferably thin insulator 30, e.g. a solder mask, is directly disposed on the sensor face 28. An electrically conductive element 32 is disposed between this insulator 30 and the underside 16 of the cover plate 12. The conductive element 32 may be directly disposed on the insulator 30 or it may be connected thereto by way of an adhesive 34. The adhesive 34 may be a conductive adhesive or a non-conductive adhesive.

The non-conductive cover plate 12, the conductive element 32, optionally the adhesive 34 and the non-conductive insulator 30 together form the dielectric system 36 of the capacitive switch 10. A capacitor is formed by the sensor face 28 as a first capacitor plate (first pole) and a user's finger 20 as a second capacitor plate (second pole) and this dielectric system 36 spanning the distance between these capacitor plates 20, 28.

In contrast to conventional capacitive switches, no electrical connection means such as solder, electrically conductive adhesives or direct contact/contact interconnections have to be used. Also, in contrast to conventional switches, the sensor face 28 forming the second pole of the capacitor is disposed at the carrier plate 22 remotely from the cover plate 12.

Although the dielectric system 36 of the capacitive switch 10 is made not only by the cover plate 12 but by a combination of non-conductive elements 12, 30 and conductive elements 32, the change in capacitance due to a user's finger 20 can effectively and reliably detected by the sensor/evaluation circuit connected to the sensor face 28.

The cross-sectional areas of the components 28-34 may be essentially the same, as indicated in FIG. 1, or may be different from each other.

It is to be noted that according to the present invention the sensor face 28 has not to be disposed on a carrier plate 22 being arranged substantially parallel and at a distance from the cover plate 12. Generally, the carrier plate 22 can be arbitrarily positioned and oriented relative to the cover plate 12. For the capacitor of the capacitive switch 10, there has just to be a sensor face 28 being disposed substantially parallel to the cover plate 12 and at a distance from the underside 16 thereof.

Figure 2:
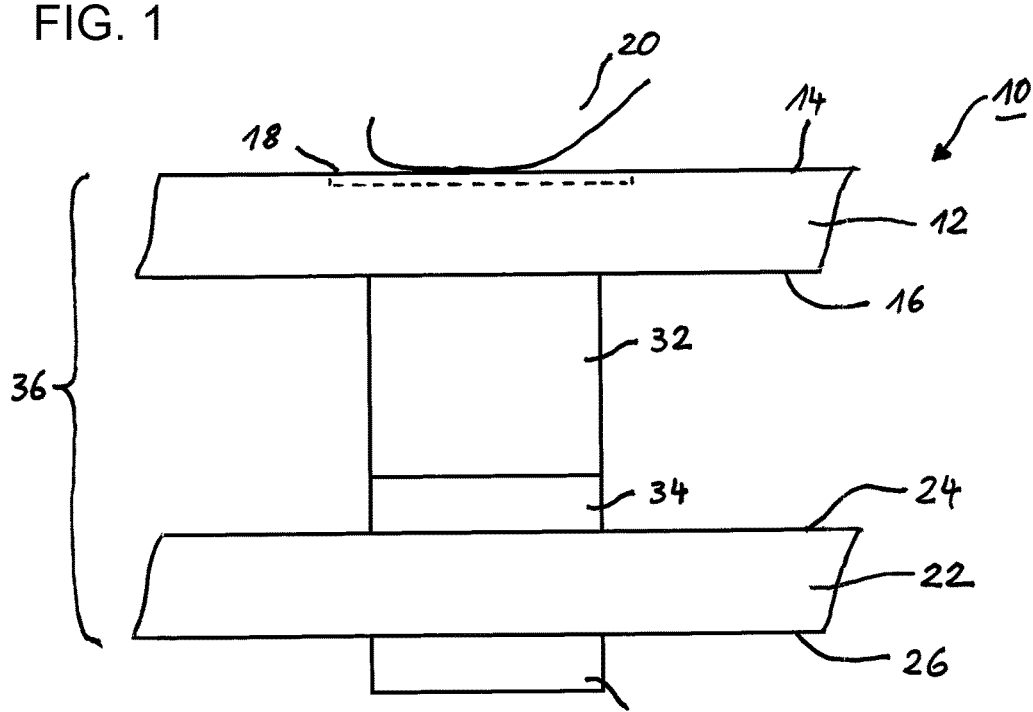
FIG. 2 is a diagrammatic, side-elevational view of a capacitive switch illustrating the basic concept of the present invention according to a second configuration.

FIG. 2 schematically shows the configuration of a capacitive proximity and/or contact switch according to a second basic concept of the present invention. Similar components are designated by the same reference numerals as in FIG. 1.

The capacitive proximity and/or contact switch 10 shown in FIG. 2 comprises a cover plate 12 made of an electrically non-conductive material and having an upper side 14 and an underside 16 and providing a sensitive area 18 at the upper side 14 thereof. A non-conductive carrier plate 22, e.g. in the form of a printed circuit board (PCB), is disposed at a distance below the cover plate 12. The carrier plate 22 has an upper side 24 facing towards the cover plate 12 and an underside 26.

In the configuration shown in FIG. 2, contrary to the configuration shown in FIG. 1, a sensor face 28 e.g. in the form of a copper pad is provided at the underside 24 of the carrier plate 24. This sensor face 28 is positioned in correspondence to the sensitive area 18 of the cover plate 12, as shown in FIG. 2, or alternatively may be offset therefrom. The sensor face 28 is connected to a sensor/evaluation circuit (not shown).

An electrically conductive element 32 is disposed between the non-conductive carrier plate 12 and the underside 16 of the cover plate 12. The conductive element 32 may be directly disposed on the carrier plate 12 or may be connected thereto by means of an adhesive 34. The adhesive 34 may be a conductive adhesive or a non-conductive adhesive.

In this configuration, the dielectric system 36 of the capacitive switch 10 is formed by the non-conductive cover plate 12, the conductive element 32, optionally the adhesive 34 and the non-conductive carrier plate 12. A capacitor is formed by the sensor face 28 as a first capacitor plate and a user's finger 20 as a second capacitor plate and this dielectric system 36 between these capacitor plates 20, 28. In comparison to the configuration shown in FIG. 1, an additional non-conductive element (e.g. insulator) 30 can be omitted.

Further, in this configuration, a single-sided carrier plate (e.g. PCB) 22, i.e. a carrier plate 22 with electronic components only at the underside 26 thereof can be used. Such a single-sided carrier plate 22 is easier to manufacture and cheaper.

The cross-sectional areas of the components 28-34 may be essentially the same, as indicated in FIG. 2, or may be different from each other.

Referring to FIGS. 3 to 9, various specific embodiments of a capacitive proximity and/or contact switch 10 according to the invention are explained in more detail below. Each of the following embodiments is in line with one of the two basic concepts illustrated in FIGS. 1 and 2.

Figure 3A:
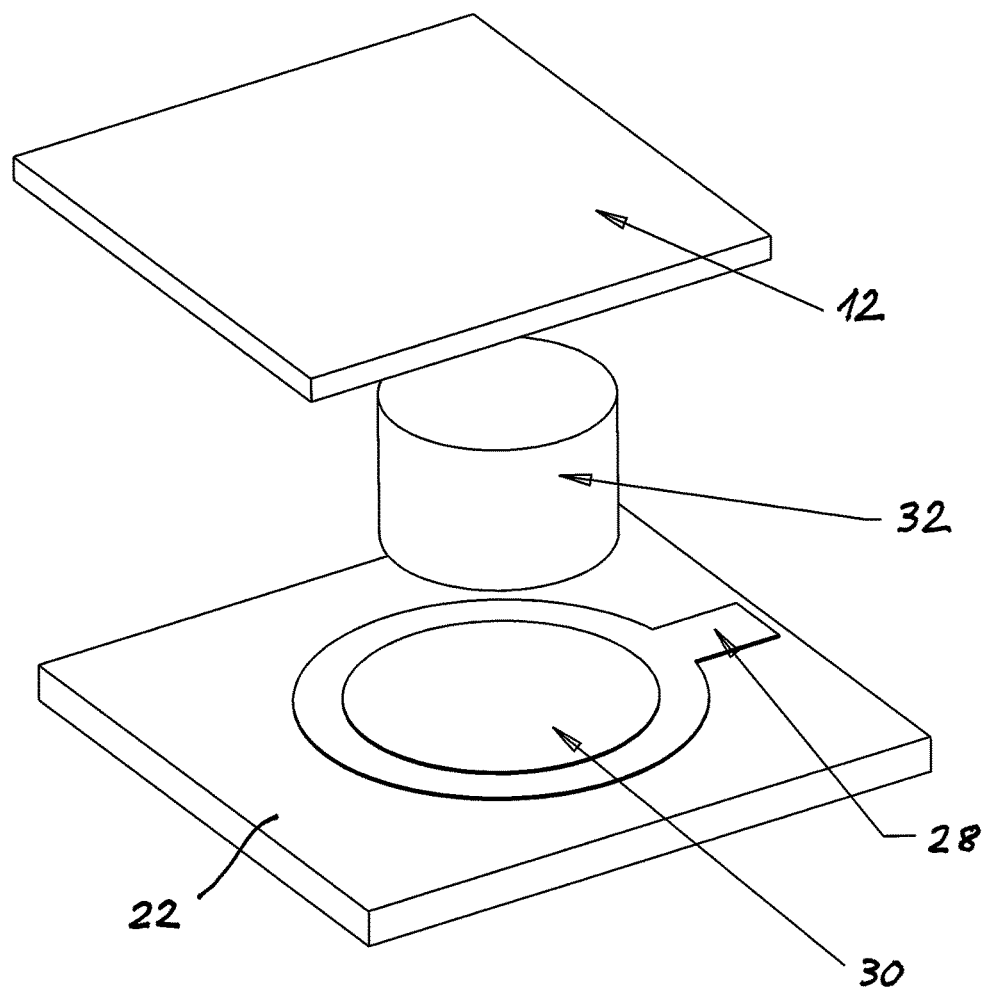
FIGS. 3A and 3B are diagrammatic, perspective, exploded and sectional views of a capacitive switch in accordance with a first exemplary embodiment of the present invention.
Figure 3B:
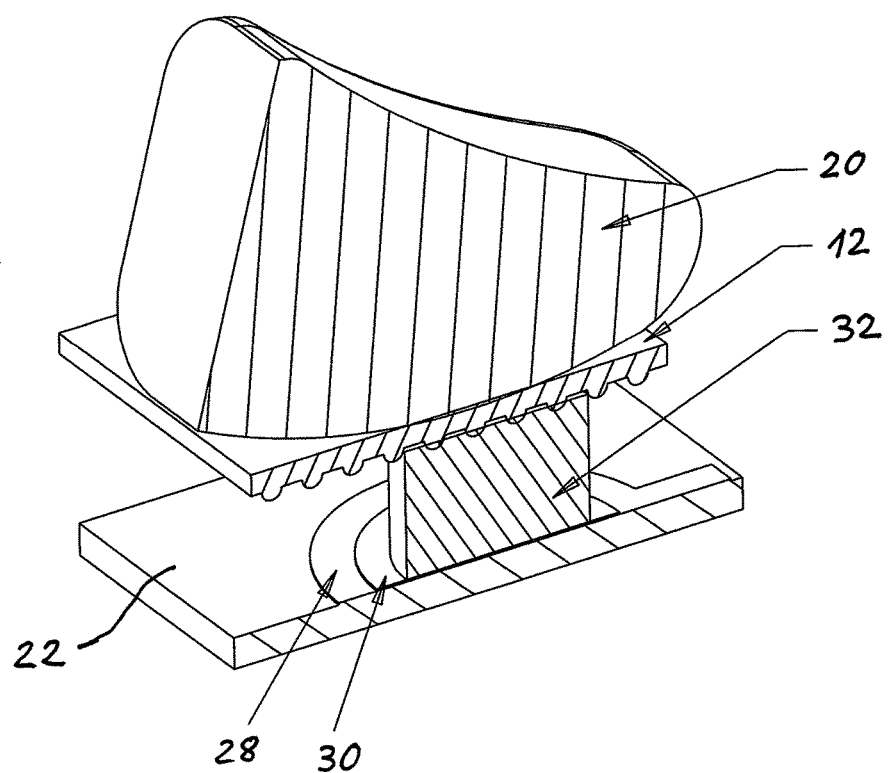

FIGS. 3A and 3B show a first embodiment of a capacitive proximity and/or contact switch according to the present invention.

The contact switch 10 comprises a cover plate 12 made of glass ceramics and a carrier plate 22 disposed at a distance behind/below the cover plate 12 and oriented substantially parallel to the cover plate 12. The first pole of the capacitor is formed by the finger 20 of a user touching or at least approaching the sensitive area 18 of the cover plate 12. The second pole of the capacitor is formed by the sensor face 28 in the form of a copper pad on the upper side 24 of the carrier plate 22 in the form of a PCB.

The dielectric system 36 of the capacitor of this capacitive switch 10 is formed by the non-conductive cover plate 12, a conductive element 32 and an insulator 30. The conductive element 32 and the insulator 30 are disposed between the cover plate 12 and the carrier plate 22 and are positioned substantially corresponding to the sensitive area 18 of the cover plate 12 and the sensor face 28 on the carrier plate 22.

In this embodiment, the insulator 30 is a solder mask applied to the upper side of the copper pad 28.

Further, the conductive element 32 is a substantially cylindrical body made of an electrically conductive plastic or rubber material, preferably in the form of a foam. The foam body 32 is flexible so that its upper side facing towards the underside 16 of the cover plate 12 is adapted to the underside 16 of the cover plate 12 which may be not planar or have a profile. The conductive foam body 32 may have incorporated conductive components (e.g. copper powder or graphite) into the plastic or rubber material (cf. U.S. Pat. No. 5,917,165; EP 0 859 467 B1) or may have the body covered with a conductive layer, coating, painting or cover (cf. US 2006/0131159; EP 1 672 797 B1).

The conductive foam body 32 may be connected to the solder mask 30 and/or to the underside 16 of the cover plate 12 by means of an adhesive, preferably a simple, non-conductive adhesive.

Figure 4A:
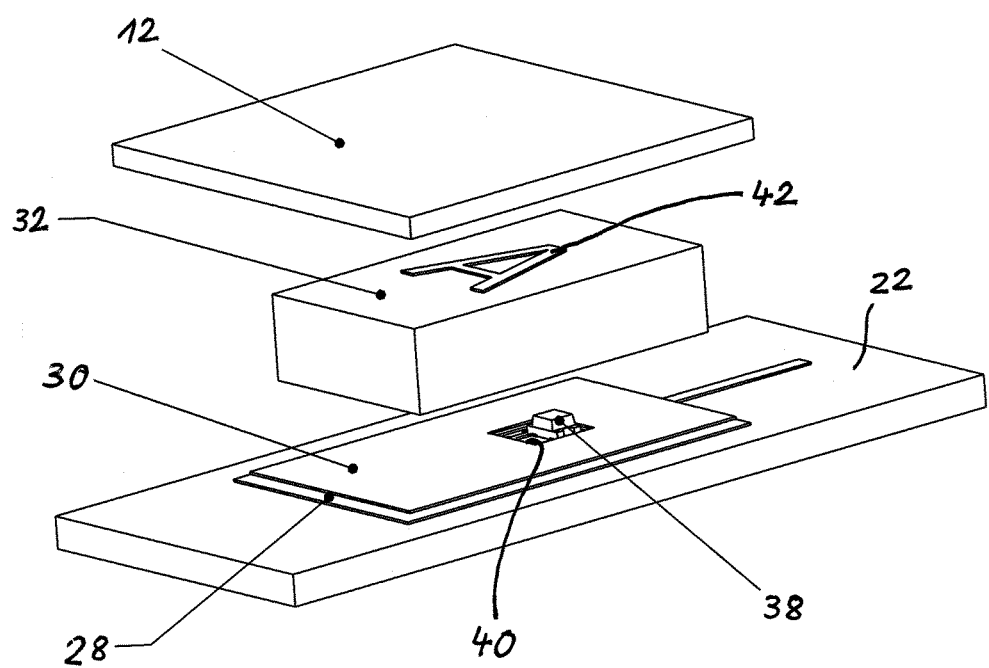
FIGS. 4A and 4B are diagrammatic, perspective, exploded and sectional views of a capacitive switch in accordance with a second exemplary embodiment of the present invention.
Figure 4B:
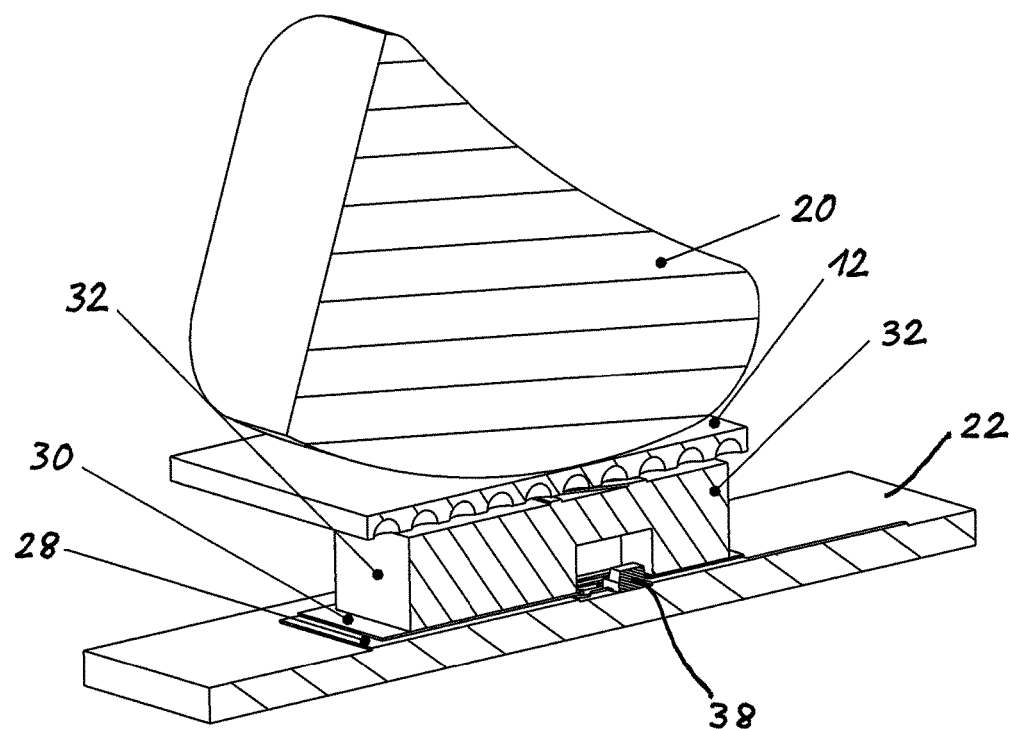

FIGS. 4A and 4B show a second embodiment of a capacitive proximity and/or contact switch according to the present invention. Same or similar components are designated by the same reference numerals as in the first embodiment.

The contact switch 10 comprises a cover plate 12 made of glass ceramics and a carrier plate 22 disposed at a distance behind/below the cover plate 12 and oriented substantially parallel to the cover plate 12. The cover plate 12 is substantially translucent at least in the region of the sensitive area 18. The first pole of the capacitor is formed by the finger 20 of a user touching or at least approaching the sensitive area 18 of the cover plate 12. The second pole of the capacitor is formed by the sensor face 28 in the form of a copper pad on the upper side 24 of the carrier plate 22 in the form of a PCB.

The dielectric system 36 of the capacitor of this capacitive switch 10 is formed by the non-conductive cover plate 12, a conductive element 32 and an insulator 30. The conductive element 32 and the insulator 30 are disposed between the cover plate 12 and the carrier plate 22 and are positioned substantially corresponding to the sensitive area 18 of the cover plate 12 and the sensor face 28 on the carrier plate 22.

In this embodiment, the insulator 30 is a solder mask applied to the upper side of the copper pad 28.

As shown in FIGS. 4A and 4B, in this embodiment, a light emitting diode 38 is mounted on the upper side 24 of the PCB 22 in the region of the sensor face 28. Further, the solder mask 30 comprises an opening 40 which is positioned such that the light emitting diode 38 protrudes through this opening 40 in the direction towards the cover plate 12.

In this embodiment, the conductive element 32 is a light guiding element which is coated or painted with an electrically conductive layer. At the upper side of this element facing towards the cover plate 12, there is optionally provided a sign 42, e.g. made of an opaque mask. Further, the light guiding body of the conductive element 32 may be a flexible body, similar to the first embodiment.

With this configuration of the capacitive switch 10, the sensitive area 18 of the cover plate 12 can be illuminated or back-lit by means of the light emitting diode 38 emitting a radiation which is transmitted through the light guiding body of the conductive element 32 towards the translucent cover plate 12. With the sign 42, the function of this switch 10 can be displayed for the user so that the user can easily distinguish between different switches 10.

Figure 5:
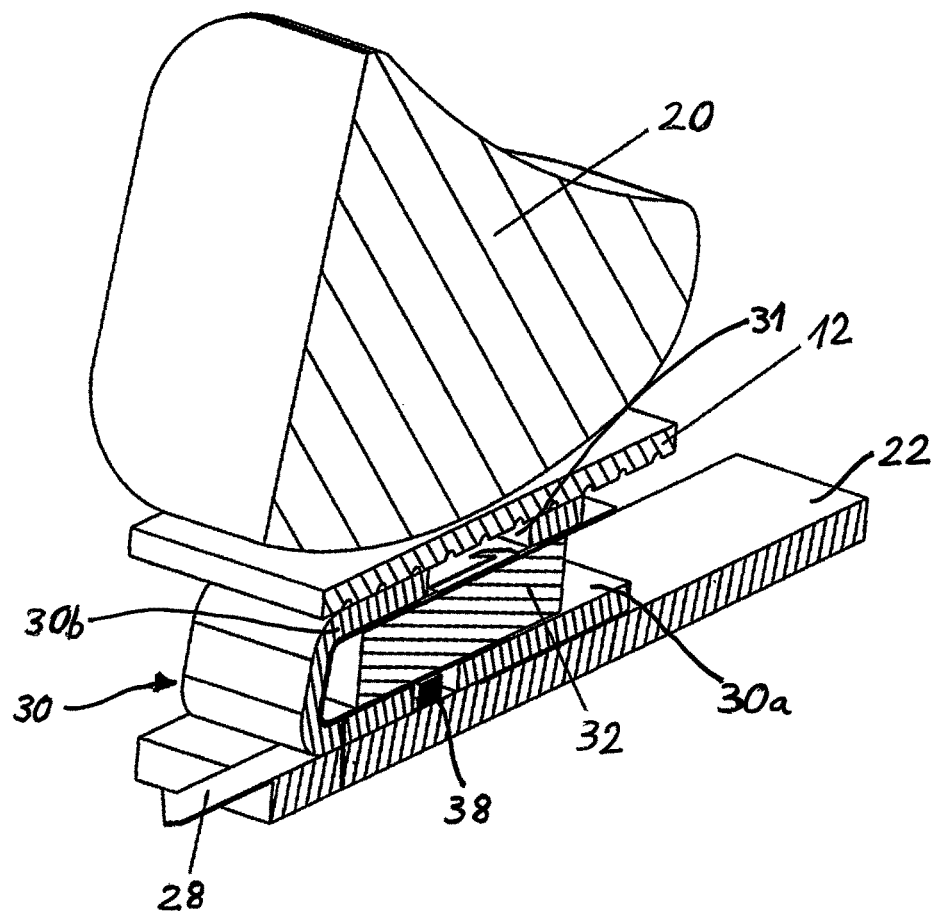
FIG. 5 is a diagrammatic, perspective, sectional view of a capacitive switch in accordance with a third exemplary embodiment of the present invention.

FIG. 5 shows a third embodiment of a capacitive proximity and/or contact switch according to the present invention. Same or similar components are designated by the same reference numerals as in the above embodiments.

This third embodiment is a modification of the second embodiment with regard to the non-conductive element 30 of the dielectric system 36 of the switch 10. In comparison with the second embodiment shown in FIGS. 4A and 4B, the non-conductive element 30 of the switch 10 of FIG. 5 is formed by a plate-like element which is bent onto itself. As a result, the non-conductive element 30 has a first portion 30a disposed between the copper pad 28 and the conductive element 32 and a second portion 30b between the conductive element 32 and the cover plate 12, wherein the first and second portions 30a, 30b of the non-conductive element 30 are interconnected by a third bent portion. Alternatively, the first and second portions 30a, 30b of the non-conductive element 30 can be configured as two separate, preferably plate-like elements being disposed at both sides of the conductive element 32.

The non-conductive element 30 can be made from plastic or rubber material. Also, the non-conductive element 30 can be made flexible.

As shown in FIG. 5, the second portion 30b of the non-conductive element 30 has an opening 31 corresponding to the light emitting diode 38 on the carrier plate 22 and the sign 42 of the conductive element 32. Alternatively, the non-conductive element 30 or at least the second portion 30b thereof can be made from a translucent material.

In the third embodiment of FIG. 5, the conductive element 32 of the dielectric system 36 is configured identically or similarly to that of the second embodiment of FIGS. 4A and 4B. However, conductive elements 32 of other configurations may also be used in combination with this third embodiment, i.e. especially with the non-conductive element 30 having these first and second portions.

Figure 6:
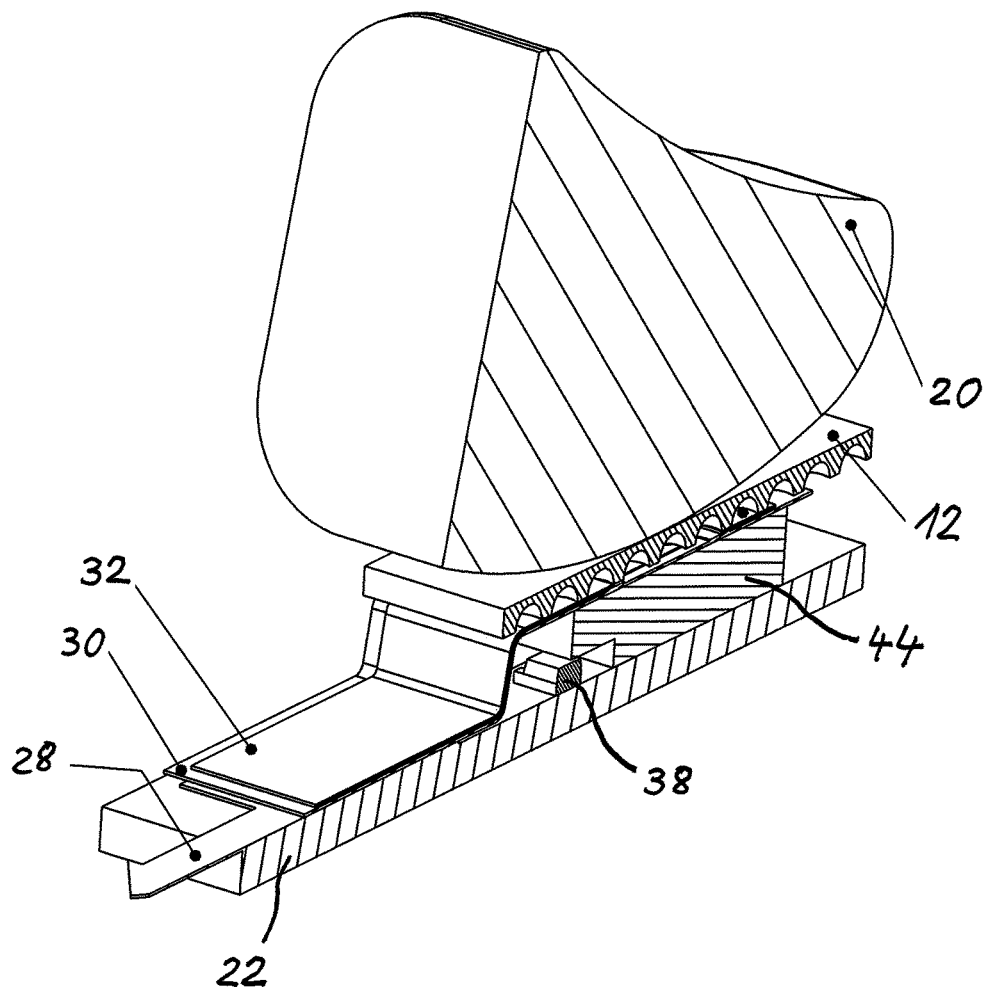
FIG. 6 is a diagrammatic, perspective, sectional view of a capacitive switch in accordance with a fourth exemplary embodiment of the present invention.

FIG. 6 shows a fourth embodiment of a capacitive proximity and/or contact switch according to the present invention. Same or similar components are designated by the same reference numerals as in the above embodiments.

This fourth embodiment is a further modification of the second and third embodiments. As shown in FIG. 6, the sensor face 28 is positioned on the upper side 24 of the carrier plate 22 offset to the sensitive area 18 of the cover plate 12. Positioned corresponding to the sensitive area 18 of the cover plate 12 there are provided a light emitting diode 38 on the carrier plate 22 and a light guiding element 44.

The dielectric system 36 of this capacitive switch 10 comprises a non-conductive element 30 in the form of a plastic label carrier having a first portion disposed on the sensor face 28 and a second portion arranged between the light guiding element 44 and the cover plate 12. The second portion of the plastic label carrier 30 has an opening or, alternatively, may be translucent. The upper side of the plastic label carrier 30, i.e. the side thereof facing towards the cover plate 12, is covered with a conductive paint or foil forming the conductive element 32 of the dielectric system 36.

Figure 7:
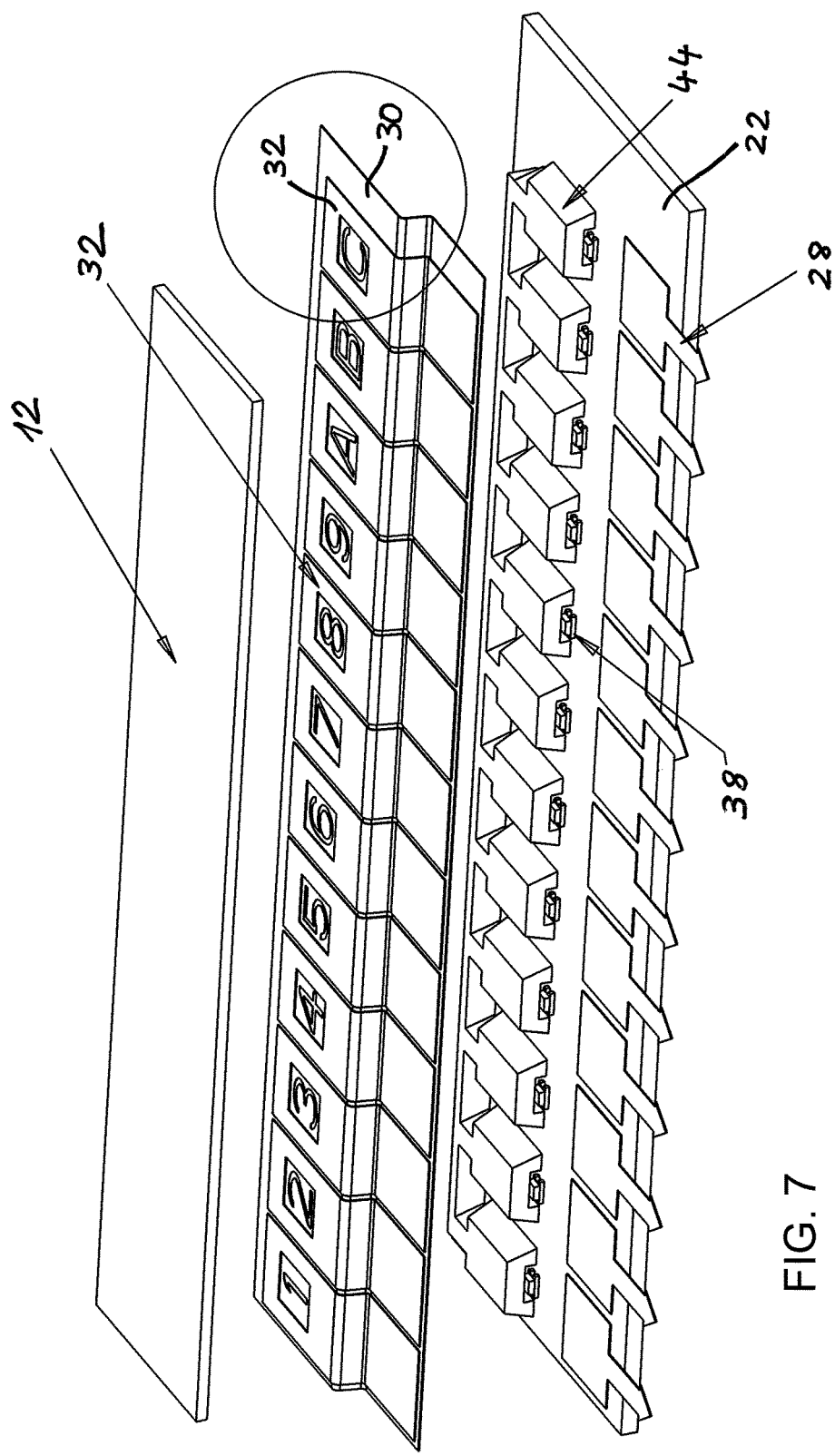
FIG. 7 is a diagrammatic, perspective, exploded view of an arrangement of a plurality of capacitive switches shown in FIG. 6.

FIG. 7 shows an arrangement of a plurality of capacitive switches 10 according to the fourth embodiment shown in FIG. 6 for forming a control panel of an electronic appliance. As shown in FIG. 7, the sensor faces 28 of the switches 10 are arranged in a line next to each other on a common carrier plate 22. Also the light emitting diodes 38 are mounted on this common carrier plate 22. The light guiding elements 44 are connected to each other. As indicated in FIG. 7, the light guiding elements 44 of the switches 10 are provided with different signs 42 in accordance with the different functions of the switches 10.

Further, the dielectric systems 36 of the switches 10 comprise a common non-conductive element 30 in the form of the plastic label carrier. This common non-conductive element 30 is covered with portions of conductive paint or foil as separate conductive elements 32.

At last, there is a common cover plate 12 for this plurality of switches 10.

Figure 8A:
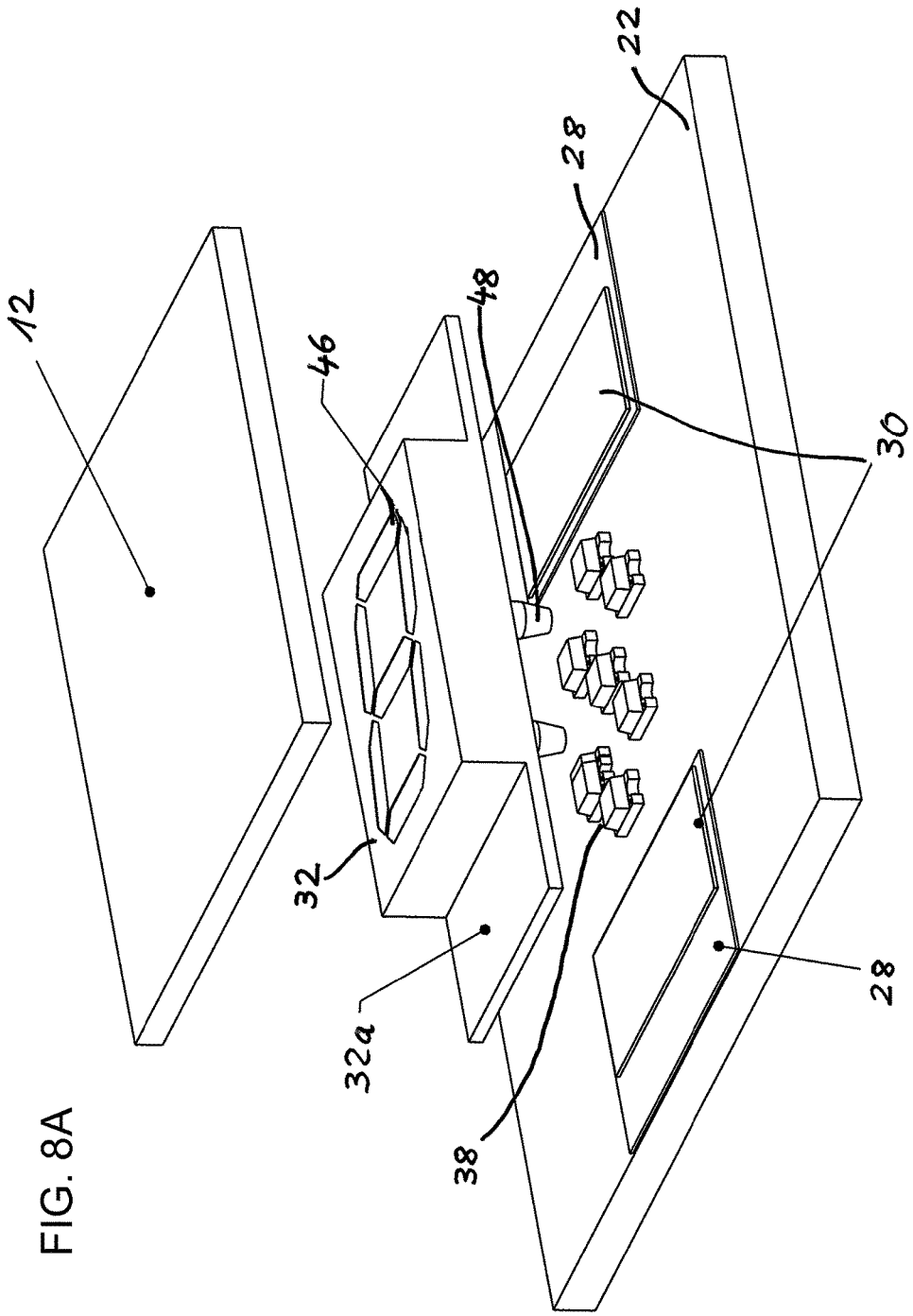
FIGS. 8A and 8B are diagrammatic, perspective, exploded and sectional views of a capacitive switch in accordance with a fifth exemplary embodiment of the present invention.
Figure 8B:
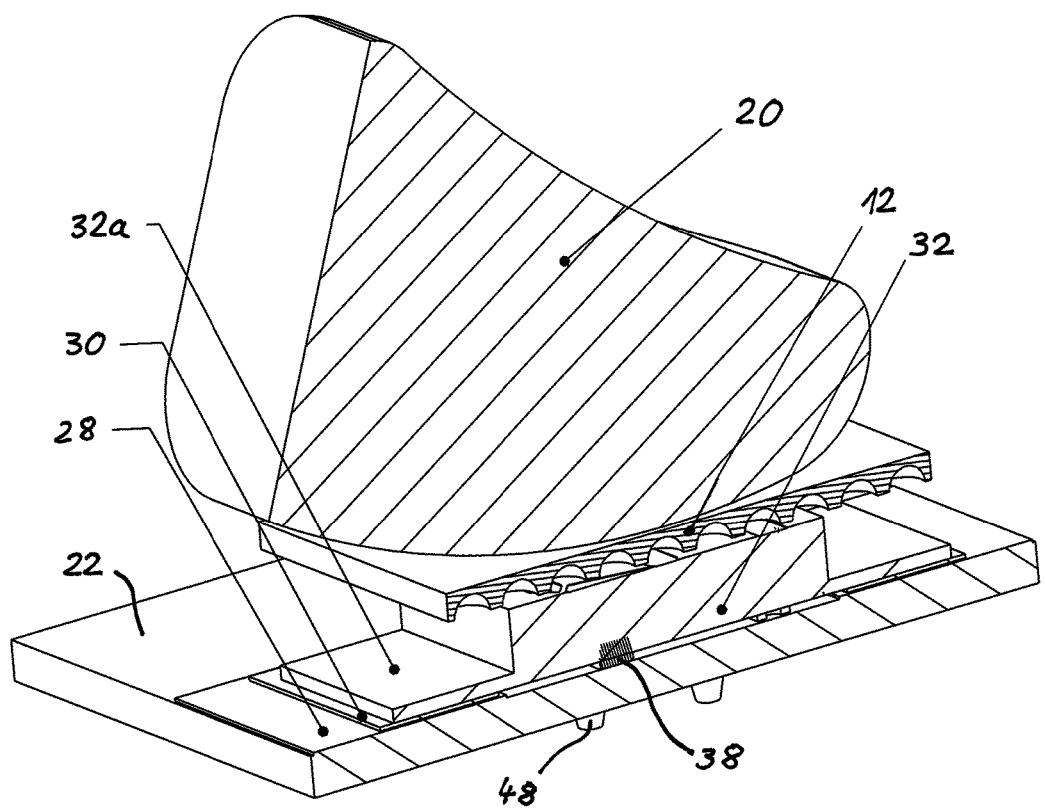

FIGS. 8A and 8B show a fifth embodiment of a capacitive proximity and/or contact switch according to the present invention. Same or similar components are designated by the same reference numerals as in the above embodiments.

The contact switch 10 comprises a cover plate 12 made of glass ceramics and a carrier plate 22 disposed at a distance behind/below the cover plate 12 and oriented substantially parallel to the cover plate 12. The cover plate 12 is substantially translucent at least in the region of the sensitive area 18. The first pole of the capacitor is formed by the finger 20 of a user touching or at least approaching the sensitive area 18 of the cover plate 12. The second pole of the capacitor is formed by two sensor faces 28 in the form of a copper pad on the upper side 24 of the carrier plate 22 in the form of a PCB. In this embodiment, the two sensor faces 28 are positioned offset to the sensitive area 18 of the cover plate 12 and spaced apart from each other.

The region between the two sensor faces 28 is used to mount a number of light emitting diodes 38 on the carrier plate 22. In this embodiment, there are seven light emitting diodes 38 in total to form a 7-segment-display.

The dielectric system 36 of the capacitor of this capacitive switch 10 is formed by the non-conductive cover plate 12, two insulators 30 and one conductive element 32. In this embodiment, the insulators 30 are solder masks applied to the upper side of the copper pads 28.

The conductive element 32 is a kind of a 7-segment-display housing. It may be made from an electrically conductive material (e.g. metal) or from an electrically non-conductive material (e.g. plastics) being covered by an electrically conductive layer/paint/foil and the like or having incorporated electrically conductive components. As shown in FIG. 8A, the sign is constructed from seven light guiding elements 46 extending through the conductive element 32 for transmitting the light emitted from the seven light emitting diodes 38 arranged below the conductive element 32.

Further, the conductive element 32 has two flanges 32a on opposite sides thereof. These conductive flanges 32a are disposed on top of the insulating solder masks 30 provided on the sensor faces 28.

As indicated in FIGS. 8A and 8B, the 7-segment-display housing 32 may have some protrusions 48 on its underside facing towards the carrier plate 22. These protrusions 48 can be put through corresponding holes in the carrier plate 22. When the protrusions 48 have undercuts they are fixed in these holes to mount the housing 32 on the carrier plate 22.

In addition, the flanges 32a of the conductive element 32 can be connected to the solder masks 30 by means of an adhesive, preferably a non-conductive adhesive.

In modifications of this fifth embodiment, the light emitting diodes 38 may also be mounted on the underside 26 of the carrier plate 22.

Figure 9:
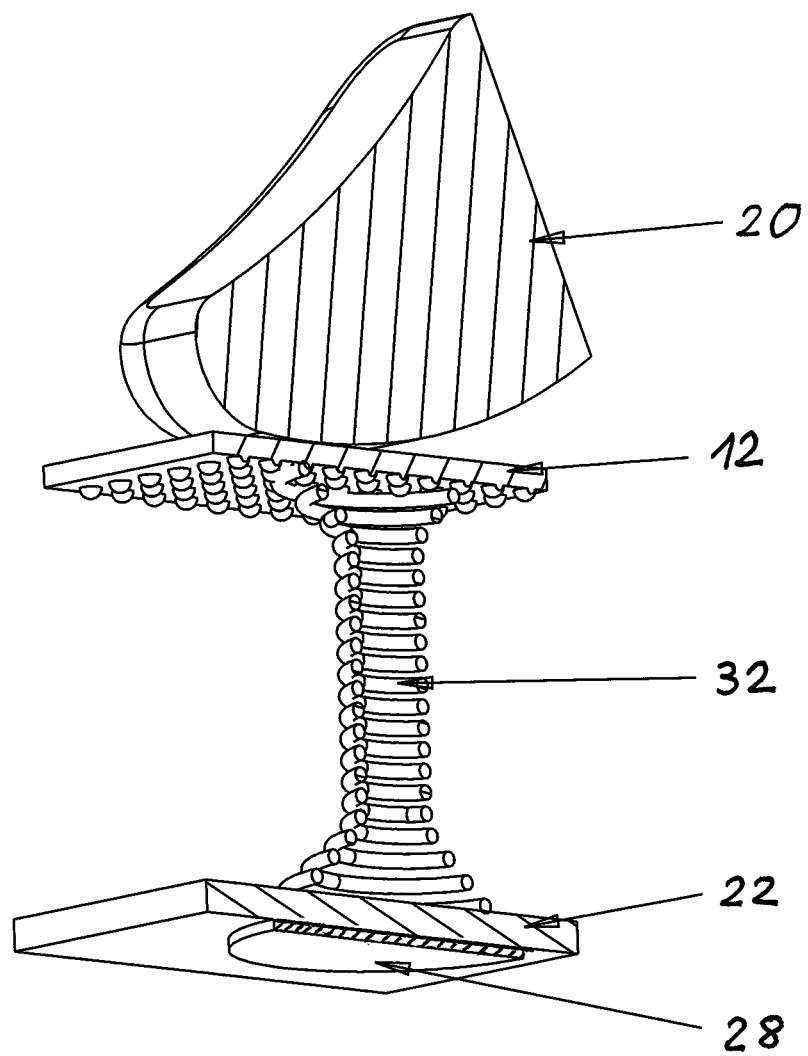
FIG. 9 is a diagrammatic, perspective, sectional view of a capacitive switch in accordance with a sixth exemplary embodiment of the present invention.

FIG. 9 shows a sixth embodiment of a capacitive proximity and/or contact switch according to the present invention. Same or similar components are designated by the same reference numerals as in the above embodiments.

The contact switch 10 of this embodiment comprises a cover plate 12 made of glass ceramics and a carrier plate 22 disposed at a distance behind/below the cover plate 12 and oriented substantially parallel to the cover plate 12. The first pole of the capacitor is formed by the finger 20 of a user touching or at least approaching the sensitive area 18 provided by the cover plate 12. The second pole of the capacitor is formed by a sensor face 28 in the form of a copper pad at the underside 26 of the carrier plate 22 in the form of a PCB.

It is to be noted that, contrary to the above-described embodiments, the sensor face 28 is arranged at the underside 26 of the carrier plate 22. For this reason, a single-sided carrier plate 22 can be used having arranged all electronic components on the underside 26 thereof.

The dielectric system 36 of the capacitor of this capacitive switch 10 is formed by the non-conductive cover plate 12, the non-conductive carrier plate 22 and a conductive element 32 arranged between the cover plate 12 and the carrier plate 22. In this embodiment, the conductive element 32 is formed by a coil or compression spring made of an electrically conductive material (e.g. metal). Alternatively, also the conductive elements 32 explained in connection with the above embodiments may be used in combination with this configuration of the capacitive switch 10.

The conductive spring 32 may be connected to the upper side 24 of the carrier plate 22 and/or to the underside 16 of the cover plate 12 by means of an adhesive, preferably a simple, non-conductive adhesive.

In addition, although not shown, holding or positioning means can be provided to position the conductive spring 32 in correspondence to the sensor face 28 and the sensitive area 18. Furthermore, although not shown, a light emitting diode and a light guiding element can be provided to have a back-lit sensitive area 18 of the cover plate 12.

While the present invention has been fully described above with reference to various preferred exemplary embodiments on the basis of the drawings, it is self-evident to a person skilled in the art that various modifications and variants can be made without departing from the scope of protection defined by the claims. Especially, the exemplary embodiments explained above can be combined with each other in many different ways to construct further embodiments.

The capacitive switches of the above and other embodiments can all advantageously used for a touch control panel, especially of an electrical appliance, in particular a domestic appliance (cooker, stove, range, oven, cook top, microwave oven, dishwasher, washing machine, clothes dryer, washer dryer, and the like).

The invention claimed is:

1. A capacitive switch, comprising:
a cover plate having an upper side and an underside, said upper side forming a sensitive area of the switch, said cover plate, at least in a region of said sensitive area, being at least partially non-conductive; and
a conductive sensor face disposed at a spacing distance from said underside of said cover plate;
a dielectric system formed of said cover plate, at least one non-conductive element facing towards said sensor face and at least one conductive element disposed between said cover plate and said non-conductive element;
at least one luminous element; and
at least one light guiding element disposed between said at least one luminous element and said cover plate, and wherein said at least one conductive element of said dielectric system includes a conductive display housing having said at least one light guiding element extending therethrough.

2. The switch according to claim 1, configured to function as a capacitive proximity switch or a capacitive contact switch.

3. The switch according to claim 2, which comprises at least one luminous element disposed at a spacing distance from said underside of said cover plate, and wherein said dielectric system is at least partially translucent.

4. The switch according to claim 2, wherein:
said sensor face is disposed on an upper side of a carrier plate, said carrier plate is disposed at a spacing distance from said underside of said cover plate, and said upper side of said carrier plate faces towards said underside of said cover plate; and
said at least one luminous element is disposed on said upper side or an underside of said carrier plate.

5. The switch according to claim 1, wherein said conductive element of said dielectric system comprises at least one of an elastic or flexible element.

6. The switch according to claim 5, wherein said conductive element of said dielectric system comprises a body made of a material selected from the group consisting of conductive foam, plastic, and rubber.

7. The switch according to claim 5, wherein said conductive element of said dielectric system comprises a conductive compression spring.

8. The switch according to claim 1, wherein said conductive element is connected to said non-conductive element of said dielectric system by way of an adhesive.

9. The switch according to claim 8, wherein said adhesive is a non-conductive adhesive.

10. The switch according to claim 1, wherein said sensor face is disposed on an upper side of a carrier plate, said carrier plate is disposed at a spacing distance from said underside of said cover plate, and said upper side of said carrier plate faces towards said underside of said cover plate, and said non-conductive element of said dielectric system comprises an insulator.

11. The switch according to claim 10, wherein said insulator of said dielectric system comprises a solder mask.

12. The switch according to claim 1, wherein said dielectric system further comprises at least one non-conductive element disposed between said cover plate and said conductive element.

13. A control panel, comprising at least one capacitive switch according to claim 1 formed as a capacitive proximity and/or contact switch.

14. The control panel according to claim 13, configured as a control panel for an electrical appliance.

15. The control panel according to claim 13, wherein said at least one capacitive switch is one of a plurality of capacitive proximity and/or contact switches and said plurality of switches include a common said cover plate.

16. A capacitive switch, comprising:
a cover plate having an upper side and an underside, said upper side forming a sensitive area of the switch, said cover plate, at least in a region of said sensitive area, being at least partially non-conductive, and said sensitive area being optically and/or haptically marked for a user of the capacitive switch;
a circuit board being a non-conductive carrier plate disposed at a fixed spacing distance from said underside of said cover plate, said carrier plate having an upper side facing towards said cover plate and an underside;
a coil or compression spring being a conductive element disposed between said underside of said cover plate and said circuit board;
wherein said spacing distance between said cover plate and said circuit board is sufficient to enable a luminous element to be disposed between said cover plate and said circuit board;
a conductive sensor face disposed on said underside of said carrier plate; and
a dielectric system formed of said cover plate, said circuit board and said conductive element disposed between, and bridging said fixed spacing distance between, said cover plate and said circuit board.

* * * * *